United States Patent
Takeuchi et al.

(10) Patent No.: US 10,643,851 B2
(45) Date of Patent: May 5, 2020

(54) COMPOUND SEMICONDUCTOR DEVICE AND PRODUCTION METHOD FOR THE SAME

(71) Applicant: DENSO CORPORATION, Kariya, Aichi-pref. (JP)

(72) Inventors: Yuichi Takeuchi, Kariya (JP); Atsuya Akiba, Kariya (JP); Katsumi Suzuki, Nagakute (JP); Sachiko Aoi, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/070,061

(22) PCT Filed: Jan. 12, 2017

(86) PCT No.: PCT/JP2017/000799
§ 371 (c)(1),
(2) Date: Jul. 13, 2018

(87) PCT Pub. No.: WO2017/145548
PCT Pub. Date: Aug. 31, 2017

(65) Prior Publication Data
US 2019/0019680 A1    Jan. 17, 2019

(30) Foreign Application Priority Data
Feb. 23, 2016 (JP) .................... 2016-032292

(51) Int. Cl.
*H01L 29/78* (2006.01)
*H01L 29/872* (2006.01)
(Continued)

(52) U.S. Cl.
CPC ........ *H01L 21/266* (2013.01); *H01L 21/0243* (2013.01); *H01L 21/0262* (2013.01);
(Continued)

(58) Field of Classification Search
CPC ........ H01L 29/1608; H01L 29/66712–66734; H01L 29/7804–7813; H01L 29/7813; H01L 29/7397; H01L 29/66068; H01L 29/4236; H01L 29/66734; H01L 29/0619; H01L 29/0623; H01L 29/063;
(Continued)

(56) References Cited

U.S. PATENT DOCUMENTS

| | | | |
|---|---|---|---|
| 2010/0224932 A1* | 9/2010 | Takaya | H01L 29/0623 257/330 |
| 2014/0145212 A1 | 5/2014 | Takeuchi et al. | |

(Continued)

*Primary Examiner* — Yu Chen
(74) *Attorney, Agent, or Firm* — Posz Law Group, PLC

(57) ABSTRACT

A compound semiconductor device includes a semiconductor substrate having a ground layer of a first conductivity type made of a compound semiconductor, a first conductivity type region formed at a corner portion of a bottom of a deep trench formed to the ground layer, and a deep layer of a second conductivity type formed in the deep trench so as to cover the first conductivity type region. A cross section of the first conductivity type region is a triangular shape or a rounded triangular shape in which a portion of the first conductivity type region being in contact with the deep layer is recessed to have a curved surface.

4 Claims, 6 Drawing Sheets

(51) Int. Cl.
  *H01L 21/266* (2006.01)
  *H01L 21/02* (2006.01)
  *H01L 29/10* (2006.01)
  *H01L 29/66* (2006.01)
  *H01L 29/06* (2006.01)
  *H01L 29/16* (2006.01)
  *H01L 29/20* (2006.01)
  *H01L 29/423* (2006.01)

(52) U.S. Cl.
  CPC .. *H01L 21/02378* (2013.01); *H01L 21/02529* (2013.01); *H01L 21/02576* (2013.01); *H01L 21/02639* (2013.01); *H01L 29/0619* (2013.01); *H01L 29/1095* (2013.01); *H01L 29/1608* (2013.01); *H01L 29/2003* (2013.01); *H01L 29/4236* (2013.01); *H01L 29/6606* (2013.01); *H01L 29/66068* (2013.01); *H01L 29/66734* (2013.01); *H01L 29/7813* (2013.01); *H01L 29/872* (2013.01)

(58) Field of Classification Search
  CPC . H01L 29/0661; H01L 29/105; H01L 29/045; H01L 29/872; H01L 29/8725; H01L 29/6606; H01L 29/7803–7808; H01L 21/0243; H01L 21/02609
  See application file for complete search history.

(56) References Cited

U.S. PATENT DOCUMENTS

| | | | |
|---|---|---|---|
| 2014/0159058 A1* | 6/2014 | Takeuchi | H01L 21/8213 257/77 |
| 2015/0048382 A1* | 2/2015 | Takeuchi | H01L 29/4236 257/77 |
| 2015/0129895 A1* | 5/2015 | Takeuchi | H01L 29/4236 257/77 |
| 2015/0179791 A1* | 6/2015 | Kudou | H01L 29/7813 257/77 |
| 2016/0104794 A1 | 4/2016 | Takeuchi et al. | |
| 2016/0260824 A1* | 9/2016 | Udrea | H01L 29/7397 |
| 2017/0012108 A1* | 1/2017 | Sakakibara | H01L 21/2033 |

* cited by examiner

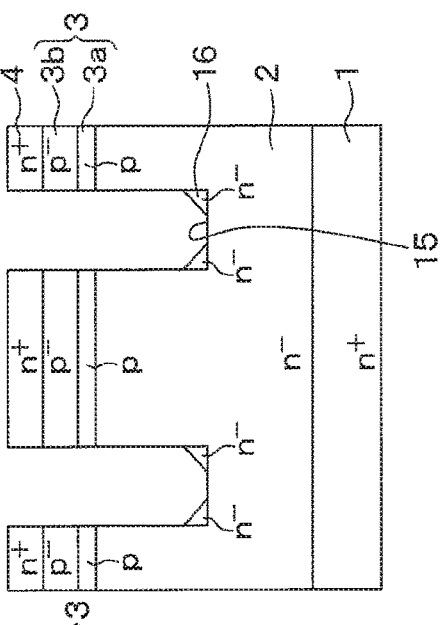
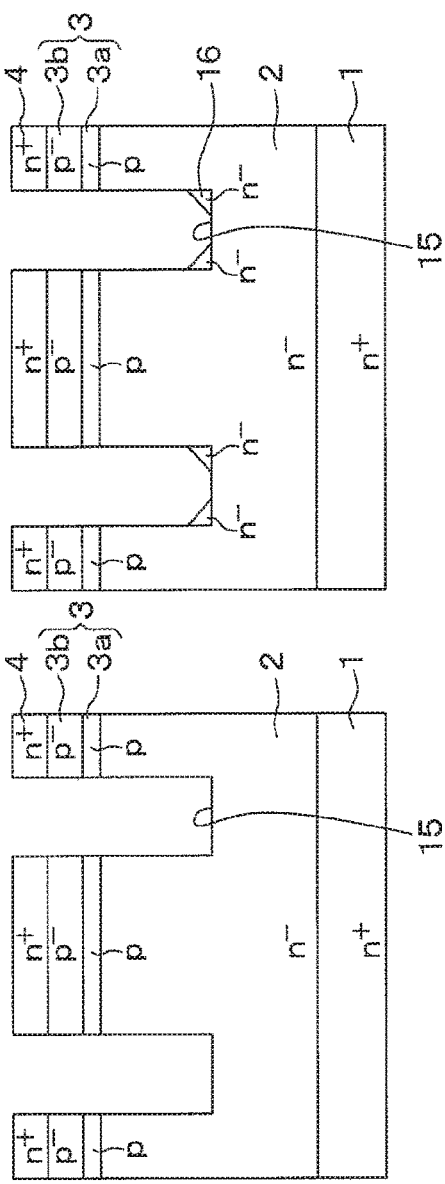
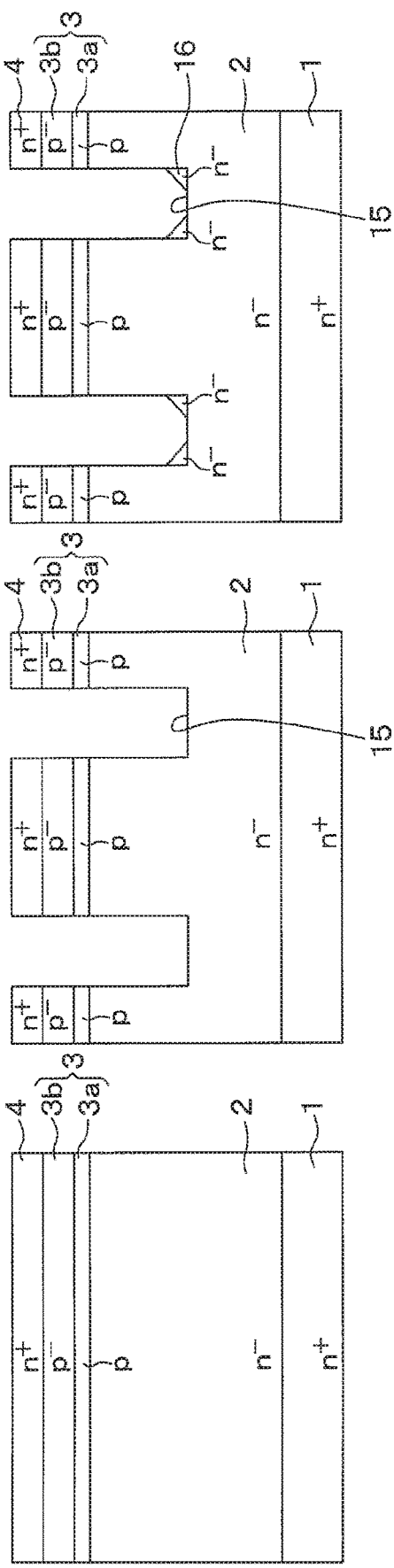
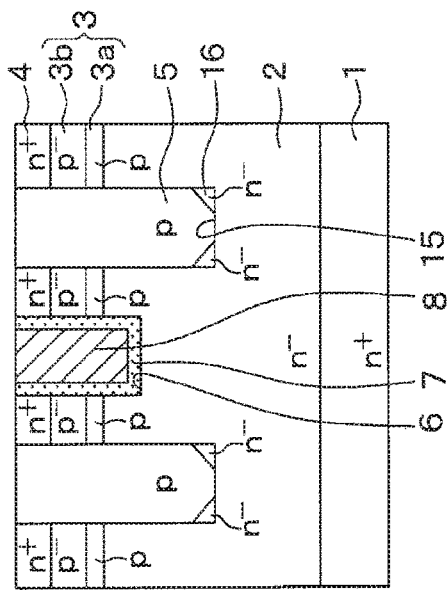
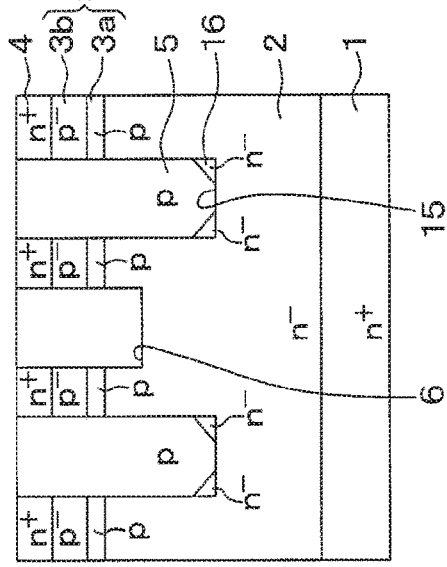
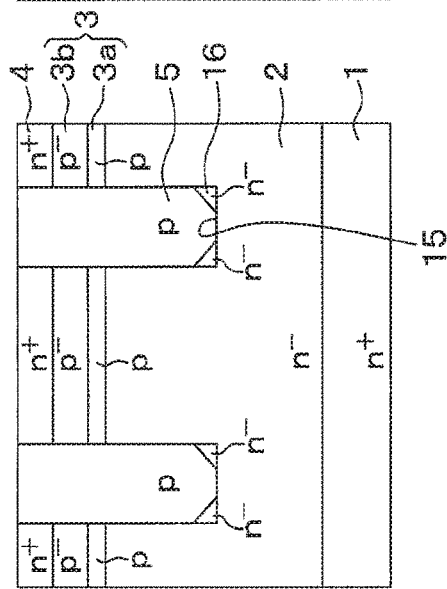

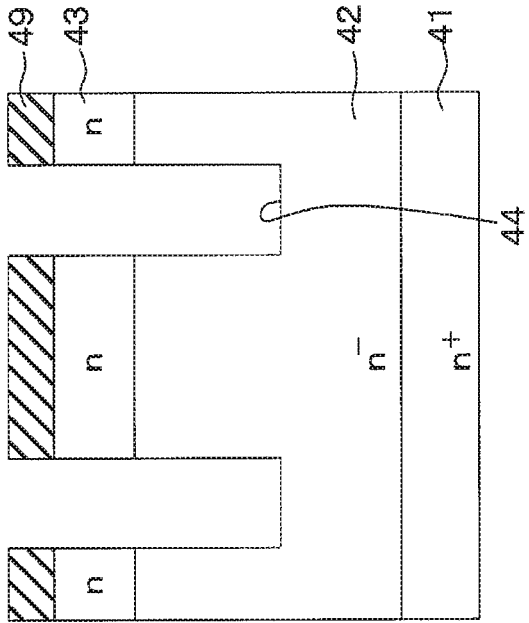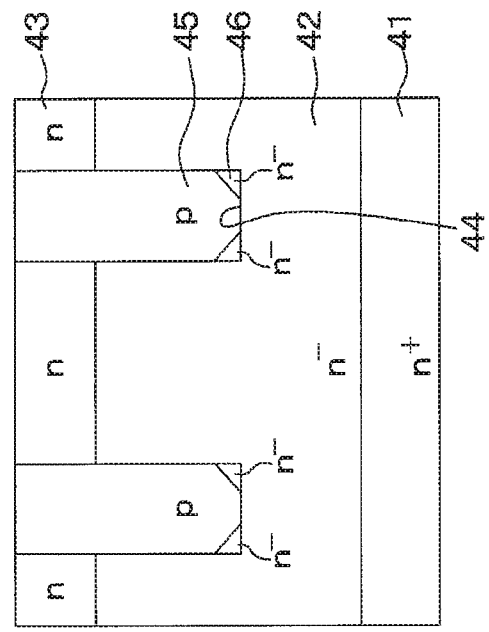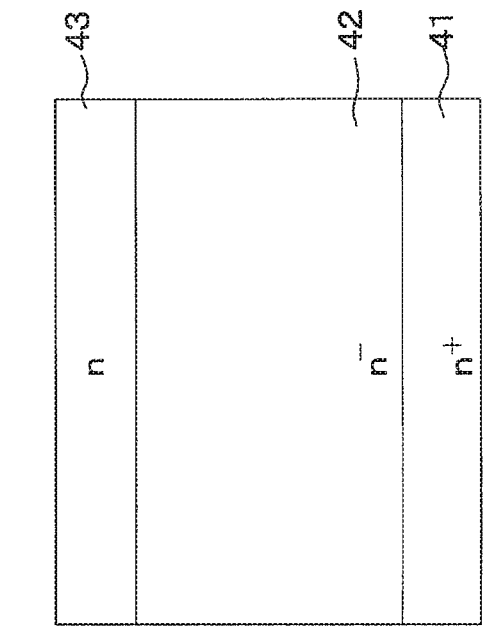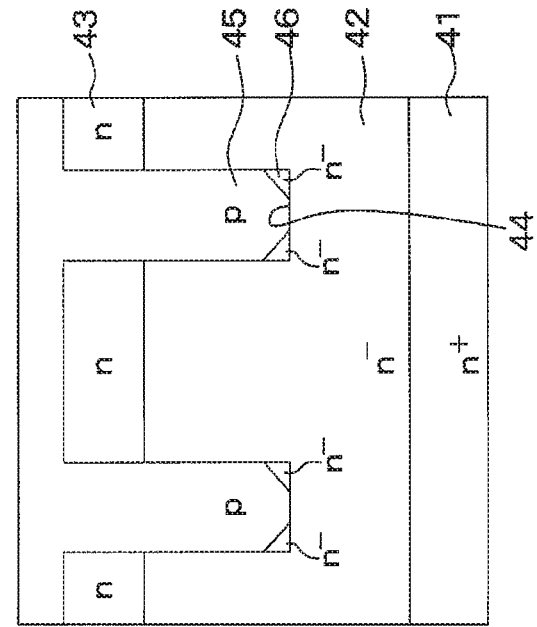

COMPOUND SEMICONDUCTOR DEVICE AND PRODUCTION METHOD FOR THE SAME

CROSS REFERENCE TO RELATED APPLICATIONS

This application is a U.S. national phase of International Application No. PCT/JP2017/000799 filed on Jan. 12, 2017, and is based on Japanese Patent Application No. 2016-32292 filed on Feb. 23, 2016, the disclosure of which is incorporated herein by reference.

TECHNICAL FIELD

The present disclosure relates to a compound semiconductor device using a compound semiconductor such as silicon carbide (hereafter referred to as SiC) and gallium nitride (hereafter referred to as GaN), and a production method for the same.

BACKGROUND ART

Conventionally, Patent Literature 1 proposes a SiC semiconductor device that includes a vertical MOSFET having an inverted trench gate structure as a vertical switching element having a trench gate structure. In the vertical MOSFET having the inverted trench gate structure, a gate voltage is applied to a gate electrode in a gate trench so that a channel is formed in a p-type base region located on a sidewall of the gate trench, and an electric current flows between a drain and a source through the channel. In such a vertical MOSFET having a trench gate structure, when a high electric field is applied to a gate insulation layer provided in the trench gate structure, a dielectric breakdown occurs and an element breakdown voltage decreases.

Thus, in the SiC semiconductor device described in Patent Literature 1, a deep trench penetrating an n$^+$-type source region and a p-type base region to an n$^-$-type drift layer is formed on both sides of the trench gate structure, and a p-type deep layer is formed in the trench. By providing the p-type deep layer, an electric field can be restricted from entering a gate insulation layer, the gate insulation layer can be protected from a high electric field, a dielectric breakdown is less likely to occur, and an element breakdown voltage can be improved.

PRIOR ART LITERATURES

Patent Literature

Patent Literature 1: JP 2014-236189 A

SUMMARY OF INVENTION

However, when the p-type deep layer is formed in the deep trench at a uniform concentration by epitaxial growth, because a corner portion at a bottom of the deep trench is pointed, an electric field strength at off-time is high at the corner portion, and a deterioration in the breakdown voltage is caused.

In order to reduce the electric field applied to the gate insulation layer in the trench gate structure at off-time, the p-type deep layer may be made deeper. However, there is such a trade-off that an on-resistance increases because a JFET portion in which a current path becomes narrower due to the p-type deep layer increases.

Although the vertical MOSFET is exemplified here as the structure having the deep layer, the structure having the deep layer is not limited to the vertical MOSFET. For example, a junction barrier diode (hereafter, referred to as JBS) can also be made as a structure having a deep layer. Also in such a case, when the deep layer is made deeper, an issue that a JFET portion increases and an on-resistance increases may be caused similarly to the above-described case.

It is an object of the present disclosure to provide a compound semiconductor device that can restrict an increase in on-resistance and a production method of a compound semiconductor device.

A compound semiconductor device according to an aspect of the present disclosure includes a semiconductor substrate having a ground layer of a first conductivity type made of a compound semiconductor, a first conductivity type region formed at a corner portion of a bottom of a deep trench formed to the ground layer, and a deep layer of a second conductivity type formed in the deep trench so as to cover the first conductivity type region. A cross section of the first conductivity type region is a triangular shape or a rounded triangular shape in which a portion of the first conductivity type region being in contact with the deep layer is recessed to have a curved surface.

In this way, the first conductivity type region is formed at a corner portion on a bottom side of the deep layer, that is, the corner portion on the bottom side of the deep trench. Thus, a cross section of the corner portion on the bottom side of the deep layer can have an obtuse angle or a rounded shape. Accordingly, at the corner portion on the bottom side of the deep layer, an increase in electric field strength due to an electric field concentration at off-time can be restricted. In addition, because a deterioration in breakdown voltage can be restricted, the deep layer needs not be formed deeper than necessary, and an increase in on-resistance can be restricted.

BRIEF DESCRIPTION OF DRAWINGS

FIG. 2A to FIG. 2F are cross-sectional views showing production processes of the SiC semiconductor device shown in FIG. 1;

FIG. 8A to FIG. 8D are cross-sectional views showing production processes of the SiC semiconductor device shown in FIG. 7.

EMBODIMENTS FOR CARRYING OUT INVENTION

The following describes embodiments of the present disclosure with reference to the drawings. In each of the following embodiments, the same or equivalent parts will be described with being designated by the same reference sign.

First Embodiment

A SiC semiconductor device according to a first embodiment of the present disclosure in which an inverted vertical MOSFET having a trench gate structure is formed will be described with reference to FIG. 1.

Figure 1:
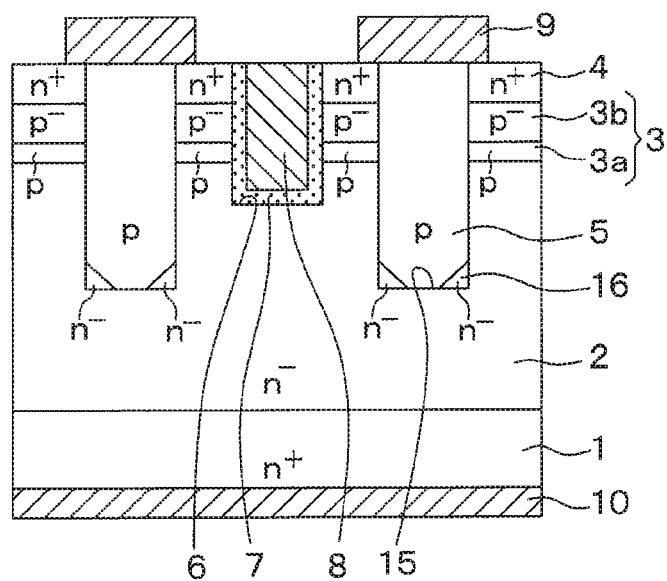
FIG. 1 is a cross-sectional view of a SiC semiconductor device including a vertical MOSFET according to a first embodiment.

In the SiC semiconductor device shown in FIG. 1, the vertical MOSFET having the trench gate structure is formed in a cell region, and an outer peripheral high breakdown voltage structure is formed in an outer peripheral region surrounding the cell region.

The SiC semiconductor device is formed using a semiconductor substrate in which an $n^-$-type drift layer 2 made of SiC having a lower impurity concentration than an $n^+$-type substrate 1 is formed on a front surface side of the $n^+$-type substrate 1 that forms a high concentration impurity layer made of SiC. The $n^+$-type substrate 1 has an n-type impurity concentration of, for example, $1.0 \times 10^{19}/cm^3$ and a front surface of the $n^+$-type substrate 1 is (0001) Si plane. The $n^-$-type drift layer 2 has an n-type impurity concentration of, for example, 0.5 to $2.0 \times 10^{16}/cm^3$.

At an upper portion of the $n^-$-type drift layer, a base region 3 is formed. In the present embodiment, the base region 3 is made of p-type SiC having a higher impurity concentration than the $n^-$-type drift layer 2 and has a structure in which a high concentration base region 3a having a relatively higher p-type impurity concentration and a low concentration base region 3b having a lower p-type impurity concentration than the high concentration base region 3a are stacked.

The high concentration base region 3a has a p-type impurity concentration higher than or equal to $5 \times 10^{17}/cm^3$, for example, $1 \times 10^{18}/cm^3$, and has a thickness of 50 to 200 nm, for example. The low concentration base region 3b has a p-type impurity concentration lower than or equal to $1.0 \times 10^{16}/cm^3$, and has a thickness of 0.3 to 1.0 μm, for example.

In addition, at an upper portion of the base region 3, an $n^+$-type source region 4 is formed. Furthermore, a p-type deep layer 5 is formed so as to penetrate the $n^+$-type source region 4 and the base region 3 from a surface of the $n^+$-type source region 4 to the $n^-$-type drift layer 2. Specifically, a deep trench 15 penetrates the $n^+$-type source region 4 and the base region 3 from the surface of the $n^+$-type source region 4 to the $n^-$-type drift layer 2, and the p-type deep layer 5 is buried in the deep trench 15. For example, an aspect ratio of a depth of the deep trench 15 is more than or equal to 2. In addition, an $n^-$-type region 16 is provided at a corner potion of a bottom of the p-type deep layer 5, that is, at a corner portion of a bottom of the deep trench 15.

The $n^+$-type source region 4 is disposed on both sides of the trench gate structure described later. The p-type deep layer 5 is formed to a position deeper than the trench gate structure on an opposite side of the $n^+$-type source region 4 from the trench gate structure so as to be buried in the deep trench 15 while covering the $n^-$-type region 16. The $n^+$-type source region 4 has an n-type impurity concentration of, for example, $2.5 \times 10^{18}$ to $1.0 \times 10^{19}/cm^3$ at a surface portion, and has a thickness of about 0.5 μm. The p-type deep layer 5 has a higher impurity concentration than the base region 3, and has a p-type impurity concentration of, for example, $1.0 \times 10^{17}$ to $1.0 \times 10^{19}/cm^3$. In the present embodiment, the p-type deep layer 5 also serves as a contact region electrically coupled with the source electrode 9 described later. The $n^-$-type region 16 is formed below the base region 3 so as to be apart from the base region 3. A cross section of the $n^-$-type region 16 is a triangular shape or a rounded triangular shape in which a portion of the $n^-$-type region 16 being in contact with the p-type deep layer 5 is recessed to have a curved surface. The n-type impurity concentration of the $n^-$-type region 16 is higher than the $n^-$-type drift layer 2, and is, for example, $1.0 \times 10^{16}$ to $4.0 \times 10^{16}/cm^3$. Because the $n^-$-type region 16 is formed, a cross section of the corner potion on the bottom side of the p-type deep layer 5 has an obtuse angle or a rounded shape, not a right angle or an acute angle.

In addition, a trench 6 having a longitudinal direction in a direction perpendicular to a paper plane is formed so as to penetrate the base region 3 and the $n^+$-type source region 4 to the $n^-$-type drift layer 2. The high concentration base region 3a and the low concentration base region 3b in the above-described base region 3 and the $n^+$-type source region 4 are disposed so as to be in contact with a sidewall of the trench 6.

In addition, a surface portion of the base region 3 located between the $n^+$-type source region 4 and the $n^-$-type drift layer 2 is set as a channel region, and a gate insulation layer 7 is formed on an inner wall of the trench 6 including the channel region. Then, a gate electrode 8 made of doped Poly-Si is formed on a surface of the gate insulation layer 7, and the trench 6 is fully filled with gate insulation layer 7 and the gate electrode 8.

The trench gate structure is formed as described above. The trench gate structure extends in a direction perpendicular to the paper plane in FIG. 1 as a longitudinal direction, and a plurality of trench gate structures is arranged in a left to right direction in FIG. 1 in a stripe pattern. In addition, the $n^+$-type source region 4 and the p-type deep layer 5 also extend along the longitudinal direction of the trench gate structure.

In addition, the source electrode 9 and gate wirings which are not shown are formed on surfaces of the $n^+$-type source region 4 and the p-type deep layer 5 and a surface of the gate electrode 8. The source electrode 9 and the gate wirings are made of a plurality of metals, for example, Ni/Al. At least portions of the plurality of metals being in contact with n-type SiC, specifically, the $n^+$-type source region 4 and the gate electrode 8 in a case of n-type dope, are made of metals that can provide an ohmic connection with n-type SiC. Further, at least a portion of the plurality of metals being in contact with a p-type SiC, specifically, the p-type deep layer 5, is made of metals that can provide an ohmic connection with p-type SiC. The source electrode 9 and the gate wirings are formed on an insulation layer which is not shown so as to be insulated. The source electrode 9 is electrically coupled with the $n^+$-type source region 4 and the p-type deep layer 5, and the gate wirings are electrically coupled with the gate electrode 8 through contact holes provided in the insulation layer.

In addition, on a rear surface side of the $n^+$-type substrate 1, a drain electrode 10 electrically coupled with the $n^+$-type substrate 1 is formed. The vertical MOSFET having the n-channel type inverted trench gate structure is composed of the above-described structure. Then, the outer peripheral high breakdown voltage structure is provided in the outer peripheral region around the cell region in which the vertical MOSFET is formed, so that the SiC semiconductor device according to the present embodiment is formed.

In the vertical MOSFET having the inverted trench gate structure provided in the above-described SiC semiconductor device, when a gate voltage is applied to the gate electrode 8, a channel is formed in a surface of the base region 3 being in contact with the trench 6. Accordingly, electrons injected from the source electrode 9 pass from the n⁺-type source region 4 through the channel formed in the base region 3 and reach the n⁻-type drift layer 2, so that electric current flows between the source electrode 9 and the drain electrode 10.

In the SiC semiconductor device according to the present embodiment, the deep trench 15 is not fully filled with the p-type deep layer 5, and the n⁻-type region 16 is formed at the corner portion of the bottom of the deep trench 15. Because the n⁻-type region 16 is formed, the cross section of the corner portion on the bottom side of the p-type deep layer 5 has an obtuse angle or a rounded shape, not a right angle or an acute angle. Accordingly, at the corner portion on the bottom side of the p-type deep layer 5, an increase in electric field strength due to an electric field concentration at off-time can be restricted. Thus, a deterioration in breakdown voltage of the vertical MOSFET can be restricted. Because a deterioration in breakdown voltage of the vertical MOSFET can be restricted by the formation of the n⁻-type region 16, the p-type deep layer 5 needs not be formed deeper than necessary, and an increase in on-resistance can be restricted.

In addition, the base region 3 is composed of the high concentration base region 3a and the low concentration base region 3b, and the channel is formed by the high concentration base region 3a and the low concentration base region 3b. Thus, expansion of a depletion layer in the base region 3 can be restricted by the high concentration base region 3a. Thus, full depletion of the base region 3 and punch-through can be prevented, an element breakdown voltage can be secured, and a deterioration of the gate insulation layer 7 at the bottom of the trench 6 can be prevented. In addition, because a threshold voltage depends on the p-type impurity concentration of the high concentration base region 3a, a high threshold voltage can be obtained.

Furthermore, because a channel mobility is increased in the low concentration base region 3b, the on-resistance can be reduced even with the high concentration base region 3a. Thus, the vertical MOSFET having the trench gate structure can reduce the on-resistance, can secure the element breakdown voltage, and can obtain a high threshold voltage.

Furthermore, because the high concentration base region 3a exists, at off-time, an effect of extracting carriers generated from a junction between the n⁻-type drift layer 2 and the base region 3 can be improved, and a drain leak current can be reduced.

Furthermore, because all of the portion of the base region 3 being in contact with the n⁻-type drift layer 2 is set as the high concentration base region 3a having the high p-type impurity concentration, a threshold voltage at when an electric current flows in a built-in diode composed of a PN junction of the n⁻-type drift layer 2 and the base region 3 can be reduced. Thus, the on-resistance of the built-in diode can be reduced, and a loss at a synchronous rectification driving that positively uses the built-in diode can be reduced.

Furthermore, at off-time, due to a depletion layer expanding from the high concentration base region 3a toward the n⁻-type drift layer 2, equipotential lines are less likely to enter under the trench gate structure. Thus, the electric field concentration applied to the gate insulation layer 7 at the bottom the trench 6 can be relaxed, a life time of the gate insulation layer 7 and a life time of a reverse bias can be improved.

Next, a production method of the SiC semiconductor device according to the present embodiment configured as shown in FIG. 1 will be described with reference to FIG. 2A to FIG. 2F and FIG. 3.

[Process Shown in FIG. 2A]

First, as a semiconductor substrate, a so-called epitaxial substrate in which the n⁻-type drift layer 2 made of SiC is epitaxially grown on the surface of the n⁺-type substrate 1 made SiC is prepared. Then, the epitaxial substrate is disposed in an epitaxial growth apparatus, and the high concentration base region 3a, the low concentration base region 3b, and the n⁺-type source region 4 are epitaxially grown in order on the surface of the n⁻-type drift layer 2.

[Process Shown in FIG. 2B]

After a mask material which is not shown is disposed on the surface of the n⁺-type source region 4, portions in the mask material where the p-type deep layer 5 and the n⁻-type region 16 are to be formed are opened by photolithography. Then, anisotropic etching such as RIE (Reactive Ion Etching) is carried out in a state where the mask material is disposed, so that the deep trench 15 is formed at the portions where the p-type deep layer 5 and the n⁻-type region 16 are to be formed.

[Processes Shown in FIGS. 2C, 2D]

Using the epitaxial grows apparatus, which is not shown, a process of forming the n⁻-type region 16, which is shown in FIG. 2C, and a process of forming the p-type deep layer 15, which is shown in FIG. 2D are successively performed.

Figure 3:
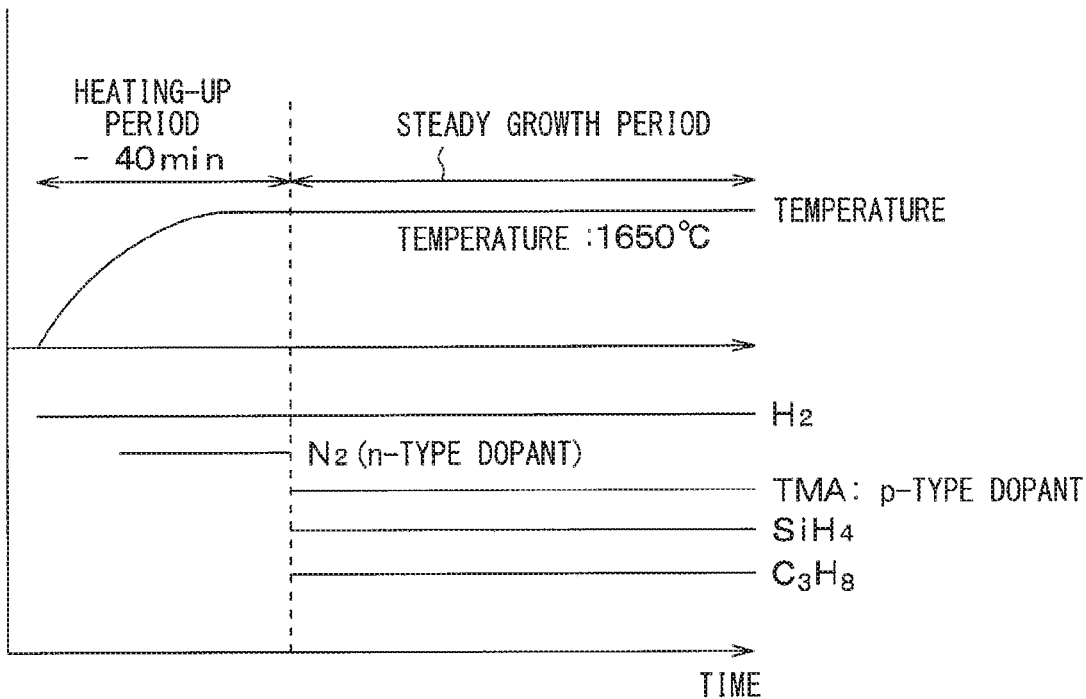
FIG. 3 is a timing diagram showing a growth program of an n$^-$-type region and a p-type deep layer in a deep trench according to the first embodiment.

Specifically, as shown in FIG. 3, a temperature in the epitaxial growth apparatus is increased to 1650° C. as a heating-up period. The heating-up period is, for example, a time within 40 minutes. At the time, a dopant gas including an n-type dopant is introduced. After that, the dopant gas including the n-type dopant is switched to a dopant gas including a p-type dopant while introducing a SiC source gas, thereby the p-type deep layer 5 is epitaxially grown while forming the n⁻-type region 16.

As the SiC source gas, for example, silane (SiH₄) working as Si source and propane (C₃H₈) working as C source can be used. As the dopant gas for forming the p-type deep layer 5, trimethylaluminium (TMA) including the p-type dopant can be used. As the dopant gas for forming the n⁻-type region 16, nitrogen (N₂) working as the n-type dopant can be used. In addition, as an etching gas, for example, hydrogen (H₂) can be introduced as necessary.

At this time, if nitrogen is introduced before introducing the SiC source gas, the n⁻-type region 16 can be formed at the bottom of the deep trench 15 by Si elements and C elements that exist due to sublimation into atmosphere, or at the beginning of introduction of the SiC source gas. At this time, the formation of the n⁻-type region 16 is performed before the formation of the p-type deep layer 5, and the p-type deep layer 5 can be formed after the n⁻-type region 16 is formed. Especially in a case where an organic metal material is used as the dopant like the p-type dopant, the dopant is adhered to an inner wall of a chamber in the epitaxial growth apparatus at the beginning of the gas introduction and it takes time until a desired p-type impurity concentration is obtained, that is, a rising delay occurs. Thus, the n⁻-type region 16 can be formed more easily. In addition, because the temperature in the chamber in the epitaxial growth apparatus is increased while introducing the etching gas, the etching and the SiC deposition are in an equilibrium state during the heating-up period. Because the n-type dopant is introduced from the heating-up period, the n⁻-type region 16 can be appropriately formed only at the corner portion of the deep trench 15.

Then, the p-type impurity layer that is formed on the n+-type source region 4 during the formation of the p-type deep layer 5 is removed by planarization such as grinding or CMP (Chemical Mechanical Polishing) so that the surface of the n+-type source region 4 is exposed. Accordingly, the structure in which the n−-type region 16 and the p-type deep layer 5 are formed only in the deep trench 15 can be formed.

[Process Shown in FIG. 2E]

After a mask material which is not shown is disposed on the surfaces of the n+-type source region 4 and the p-type deep layer 5, a portion in mask where the trench 6 is to be formed is opened by photolithography. Then, anisotropic etching such as RIE is performed in a state where the mask material is disposed, so that the trench 6 is formed in the cell region. After that, the mask material is removed.

Then, as necessary, a hydrogen etching is performed by a heat treatment in hydrogen atmosphere under decompression at 1600° C. or higher, for example, in a high temperature hydrogen atmosphere at 1625° C. and $2.7 \times 10^4$ Pa (=200 Torr). Due to the hydrogen etching, a rounding process of the inner wall of the trench 6 is performed, an opening inlet of the corner portion of the trench 6 are rounded, and a damage of the trench etching is removed.

[Process Shown in FIG. 2F]

After the gate insulation layer 7 is formed by a thermal oxidation in a wet atmosphere, a doped Poly-Si layer is formed on the surface of the gate insulation layer 7, and the doped Poly-Si layer is patterned to be left in the trench 6 so as to form the gate electrode 8.

Processes after this are similar to conventional processes. In other words, a forming process of the interlayer insulation layer, a contact hole forming process by photo etching, a process of forming the source electrode 9 and the gate wiring layer by deposition of electrode materials and patterning after that, and a process of forming the drain electrode 19 to the rear surface of the n+-type substrate 1 are performed. Accordingly, the SiC semiconductor device in which the vertical MOSFET having the trench gate structure shown in FIG. 1 is provided in the cell region is completed.

As described above, in the SiC semiconductor device that include the vertical MOSFET having the inverted trench gate structure described in the present embodiment, the n−-type region 16 is formed at the corner portion on the bottom side of the p-type deep layer 5, that is, the corner portion on the bottom side of the deep trench 15. Thus, the cross section of the corner portion on the bottom side of the p-type deep layer 5 can have an obtuse angle or a rounded shape. Accordingly, at the corner portion on the bottom side of the p-type deep layer 5, an increase in electric field strength due to an electric field concentration at off-time can be restricted. Thus, a deterioration in breakdown voltage of the vertical MOSFET can be restricted. Because a deterioration in breakdown voltage of the vertical MOSFET can be restricted by formation of the n−-type region 16, the p-type deep layer 5 needs not be formed deeper than necessary, and an increase in on-resistance can be restricted.

Second Embodiment

A second embodiment will be described. In the present embodiment, production processes of the p-type deep layer 5 and the n−-type region 16 are changed with respect to the first embodiment, and others are similar to the first embodiment. Thus, only portions different from the first embodiment will be described.

In the present embodiment, timings of introducing the dopant gas including the n-type dopant and the dopant gas including the p-type dopant at formation of the p-type deep layer 5 and the n−-type region 16 are changed with respect to the first embodiment.

Figure 4:
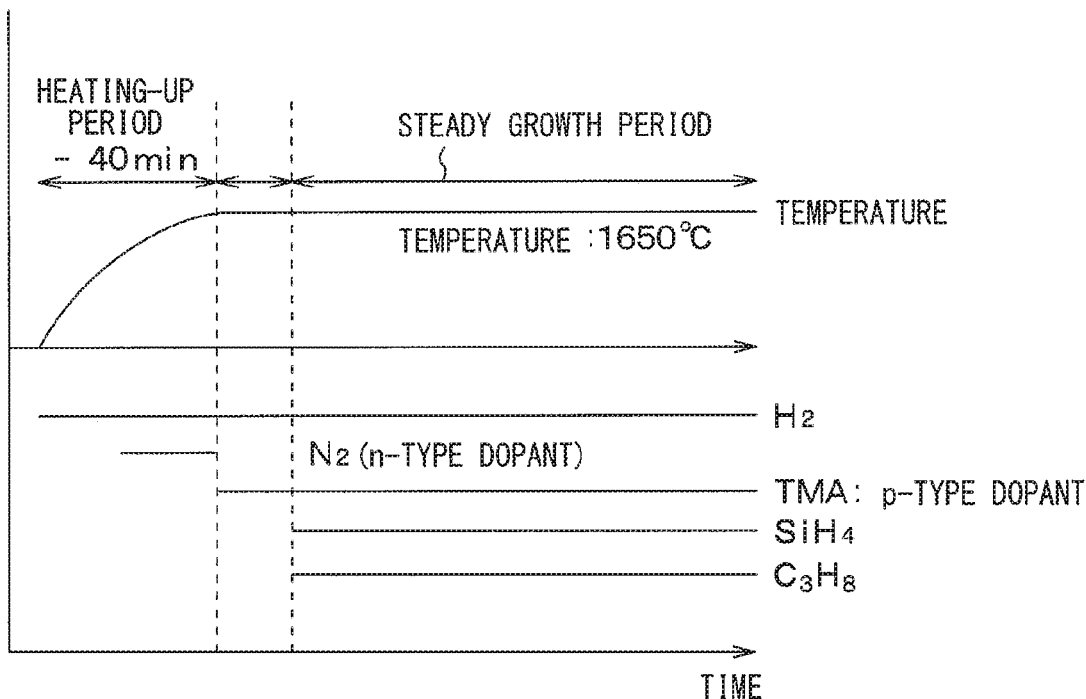
FIG. 4 is a timing diagram showing a growth program of an n$^-$-type region and a p-type deep layer in a deep trench according to a second embodiment.

Specifically, as shown in FIG. 4, the dopant gas including the n-type dopant is introduced in the heating-up period, and after that, before introducing the SiC source gas, the dopant gas including the n-type dopant is switched to the dopant gas including the p-type dopant. Then, after switching of the dopant gas, the introduction of the SiC source gas is performed.

As described above, the switching of dopant gases may be performed before the introduction of the SiC source gas, and the dopant gas including the p-type dopant may be introduced before the introduction of the SiC source gas. Accordingly, the p-type dopant can adhere to the inner wall of the chamber in the epitaxial growth apparatus before the introduction of the SiC source gas, the amount of the p-type dopant that adheres to the inner wall after the introduction of the source gas can be reduced. Thus, the p-type deep layer 5 can be formed earlier, and a range where the n−-type region 16 is formed can be reduced.

Modification of Second Embodiment

Figure 5:
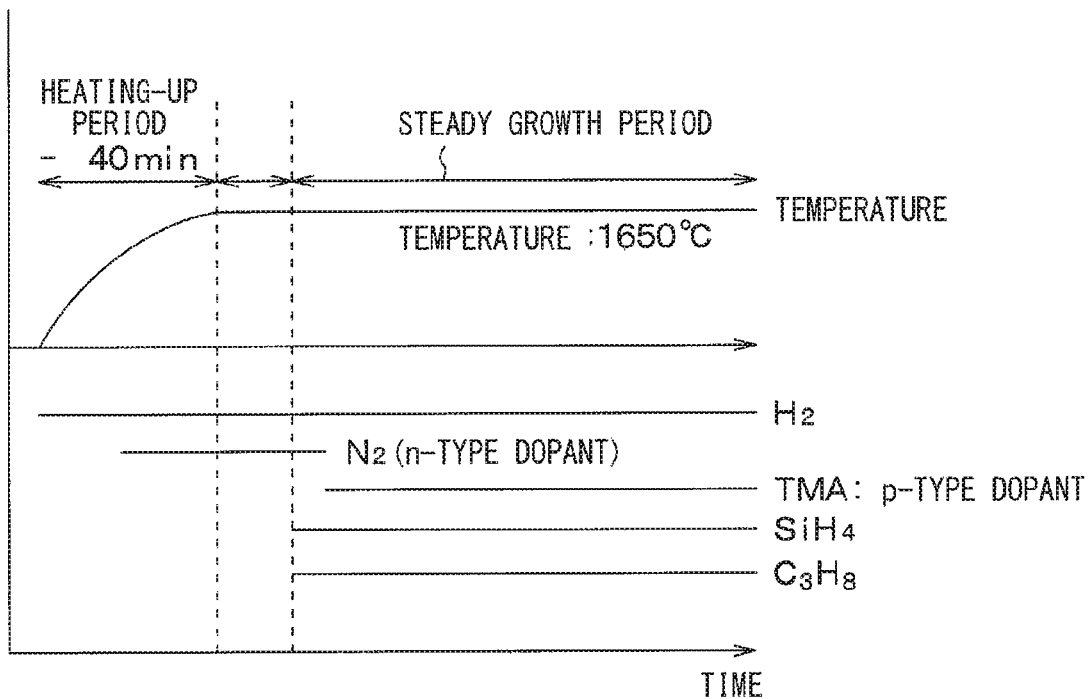
FIG. 5 is a timing diagram showing a growth program of an n$^-$-type region and a p-type deep layer in a deep trench described in a modification of the second embodiment.

In the above-described second embodiment, the switching of the dopant gases is performed before the introduction of the SiC source gas. On the contrary, as shown in FIG. 5, the switching of the dopant gases can also be performed after the introduction of the SiC source gas. Accordingly, the p-type deep layer 5 can be formed later, and the range where the n−-type region 16 is formed can be expanded.

Third Embodiment

A third embodiment will be described. In the present embodiment, a configuration of the p-type deep layer 5 is changed with respect to the first embodiment, and others are similar to the first embodiment. Thus, only portions different from the first embodiment will be described.

Figure 6:
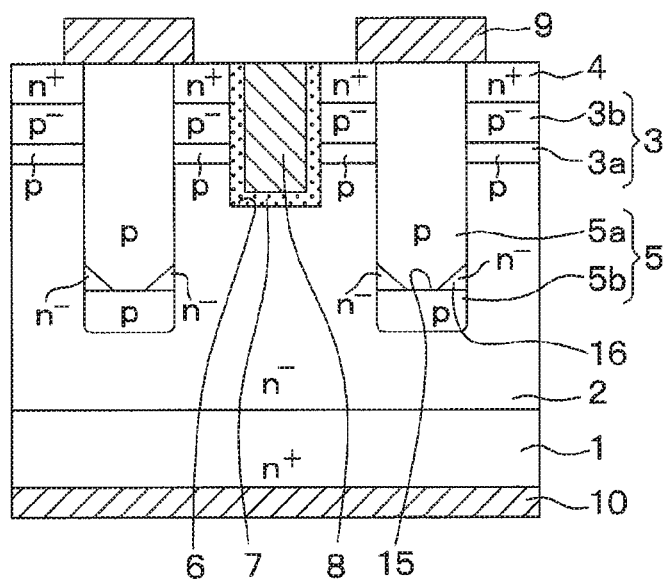
FIG. 6 is a cross-sectional view of a SiC semiconductor device including a vertical MOSFET according to a third embodiment.

As shown in FIG. 6, in the vertical MOSFET provided in the SiC semiconductor device according to the present embodiment, the p-type deep layer 5 has two-layer structure in which the p-type deep layer 5 described in the first embodiment is set as an upper p-type deep layer 5a, and a lower p-type deep layer 5b is provided below the upper p-type deep layer 5a and the n−-type region 16. The lower p-type deep layer 5b is connected with the upper p-type deep layer 5a, and the upper p-type deep layer 5a and the lower p-type deep layer 5b are set to the source potential. A corner portion on a bottom of the lower p-type deep layer 5b has a rounded shape.

In this way, the p-type deep layer 5b may be realized by the two-layer structure of the upper p-type deep layer 5a and the lower p-type deep layer 5b. Also in the case with the above-described structure, because the corner portion of the bottom of the lower p-type deep layer 5b is rounded, an electric field concentration can be restricted, and effects similar to the first embodiment can be obtained.

In addition, in the case with the above-described structure, because the n−-type region 16 is formed on the sidewall of the p-type deep layer 5, an expansion of a depletion layer that expands from the p-type deep layer 5 to the n−-type drift layer 2 can be restricted at the portion. Thus, because a depleted region of the JFET portion can be reduced and an electric current path can expand by the restriction of the expansion of the depletion layer, an on-resistance can be reduced.

A production method of the vertical MOSFET according to the present embodiment is basically similar to the first embodiment. However, after the formation of the deep trench 15, an ion implantation of the p-type dopant needs to be performed using a mask that is used at the formation of the deep layer so as to form the lower p-type deep layer 5b. If the lower p-type deep layer 5b is formed by the ion implantation as described above, the corner portion of the bottom of the lower p-type deep layer 5b can be rounded.

Fourth Embodiment

A fourth embodiment will be described. In the present embodiment, a SiC semiconductor device including, as a semiconductor element, a vertical JBS instead of a vertical MOSFET will be described.

Figure 7:
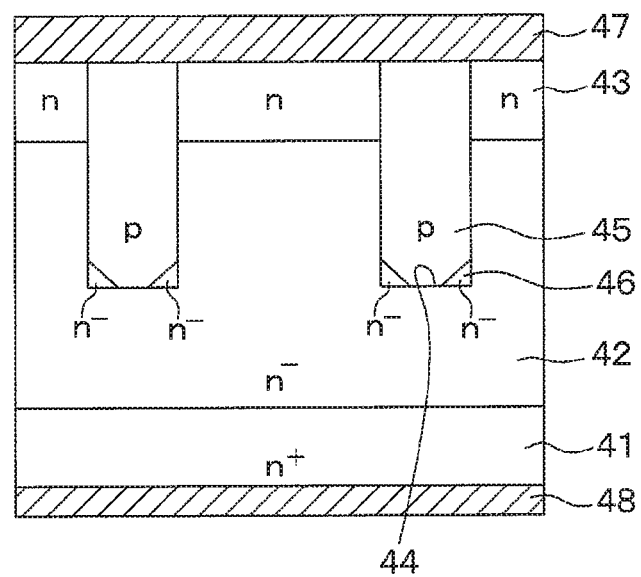
FIG. 7 is a cross-sectional view of a SiC semiconductor device including a JBS according to a fourth embodiment.

As shown in FIG. 7, the SiC semiconductor device according to the present embodiment is formed using a semiconductor substrate in which an $n^-$-type drift layer 42 made of SiC having a lower impurity concentration than an $n^+$-type substrate 41 is formed on a surface side of the $n^+$-type substrate 41 that forms a high concentration impurity layer made of SiC. As the semiconductor substrate, the same as the semiconductor substrate in the first embodiment is used.

On the $n^-$-type drift layer 42, an n-type layer 43 having a higher impurity concentration than the $n^-$-type drift layer 42 is formed. A deep trench 44 is formed so as to penetrate the n-type layer 43 to the $n^-$-type drift layer 42, a deep layer 45 is formed in the deep trench 44, and an $n^-$-type region 46 is formed at a corner potion of the deep layer 45, that is, a corner portion of the bottom of the deep trench 44.

In addition, on the n-type layer 43 and the deep layer 45, a Schottky electrode 47 is formed so as to be in contact with the n-type layer 43 and the deep layer 45. On a rear surface side of the $n^+$-type substrate 41, that is, on an opposite side from the $n^-$-type drift layer 42, an ohmic electrode 48 corresponding to a rear electrode is provided. Accordingly, the SiC semiconductor device including the vertical JBS shown in FIG. 7 is formed.

In this way, also in the SiC semiconductor device including the JBS, because the $n^-$-type region 46 is formed at the corner portion of the p-type deep layer 45, a cross section of the corner potion on the bottom side of the p-type deep layer 45 has an obtuse angle or a rounded shape, not a right angle or an acute angle. Accordingly, at the corner portion on the bottom side of the p-type deep layer 45, an increase in electric field strength due to an electric field concentration at off-time can be restricted. Thus, because deterioration in a breakdown voltage can be restricted, the p-type deep layer 45 needs not be formed deeper than necessary, and an increase in on-resistance can be restricted.

Next, a production method of the SiC semiconductor device according to the present embodiment configured as shown in FIG. 7 will be described with reference to FIG. 8A to FIG. 8D.

[Process Shown in FIG. 8A]

First, as a semiconductor substrate, a so-called epitaxial substrate in which the $n^-$-type drift layer 42 made of SiC is epitaxially grown on the surface of the $n^+$-type substrate 41 made SiC is prepared.

[Process Shown in FIG. 8B]

After a mask material 49 is disposed on the surface of the $n^-$-type drift layer 42, portions in the mask material 49 where the p-type deep layer 45 and the $n^-$-type region 46 are to be formed are opened by photolithography. Then, anisotropic etching such as RIE is carried out in a state where the mask material 49 is disposed, so that the deep trench 44 is formed at the portions where the p-type deep layer 45 and the $n^-$-type region 46 are to be formed.

[Process Shown in FIG. 8C]

After the mask material 49 is removed, processes similar to the processes shown in FIG. 2C and FIG. 2D are carried out. Accordingly, the deep trench 44 is filled with the p-type deep layer 45 and the $n^-$-type region 46.

[Process Shown in FIG. 8D]

A p-type SiC layer forming the p-type deep layer 45 formed on the surface of the n-type layer 43 is removed by, for example, grinding or CMP so as to expose the n-type layer 43.

Although processes after this are not shown, a process of forming the Schottky electrode 47 on the surfaces of the n-type layer 43 and the p-type deep layer 45, a process of forming the ohmic electrode 48 on the rear surface of the $n^+$-type substrate 41 are carried out, so that the SiC semiconductor device including the vertical JBS shown in FIG. 7 is completed.

As described above, also to the SiC semiconductor device including the vertical JBS, a structure including the p-type deep layer 45 and the $n^-$-type region 46 can be applied.

Other Embodiments

Although the present disclosure has been described based on the above-described embodiments, the present disclosure is not limited to the above-described embodiments and includes various modified examples and modification within an equivalent range. In addition, various combinations and modes, and other combinations and modes further including one element or more or less are also within a scope or an idea of the present disclosure.

For example, in each of the above-described embodiments, the $n^+$-type source region 4 is formed by epitaxial growth. However, the $n^+$-type source can also be formed by other method such as ion implantation because the $n^+$-type source region 4 only needs to be formed in the upper layer portion of the base region 3.

In the second embodiment, the base region 3 is divided into the high concentration base region 3a and the low concentration base region 3b. However, the base region 3 may be formed at a single impurity concentration. In a configuration changing an impurity concentration, the impurity concentration may be gradually changed in a boundary portion between the high concentration base region 3a and the low concentration base region 3b, and the high concentration base region 3a and the low concentration base region 3b being different in p-type impurity concentration on both sides of the boundary portion may be stacked. The low concentration base region 3b may be formed of an i-type semiconductor which is non-doped, that is, in a state few p-type dopants are doped. For example, a doped quantity of the low concentration base region 3b can be the degree to which a residual p-type dopant in an atmosphere is doped during the epitaxial growth. In this case, a channel mobility at the low concentration base region 3b can be further increased, and on-resistance can be further reduced.

In addition, in each of the above-described embodiments, a structure in which the $n^-$-type drift layer 2 is formed on the surface of the $n^+$-type substrate has been described as an example of as the substrate in which the rear surface side is the rear surface layer having the high impurity concentration and the surface side is the drift layer having the lower impurity concentration than the rear surface side. However, this is mere one example of the semiconductor substrate, and, for example, a substrate in which an n-type dopant is ion-implanted to a rear surface side of a substrate formed by the n⁻-type drift layer 2, or a rear surface layer is formed by epitaxial growth may also be used.

In the fourth embodiment, the p-type deep layer 45 and the n⁻-type region 46 similar to the first embodiment in structure and production method has been described as an example. However, production methods similar to the second embodiment and the modification of the second embodiment, and a structure and a production method similar to the third embodiment can also be applied.

In each of the above-described embodiments, the n-channel type vertical MOSFET in which a first conductivity type is n-type and a second conductivity type is p-type is explained as an example. However, the present disclosure can also be applied to a p-channel type vertical MOSFET in which a conductivity type of each components is inverted. In this case, a plane direction of a surface of a semiconductor substrate is set to a (000-1) carbon plane so that a p-type restricted layer can be epitaxially grown superiorly on a surface side of a deep trench, and an n-type deep layer can be epitaxially grown superiorly at a bottom of the deep trench.

In addition, in each of the above-described embodiments, SiC is taken as an example of a compound semiconductor, and a case in which the p-type deep layer 5 is formed on the n⁻-type drift layer 2 as the base layer is taken as an example of epitaxially growing the deep layer of the second conductivity type in the deep trench. However, this is also mere example. Namely, the present disclosure can be applied to a structure in which a deep trench is formed to a first conductivity type base layer made of a compound semiconductor, and a deep layer made of a second conductivity type compound semiconductor is epitaxially grown in the deep trench.

When an orientation of a crystal face is described, it is originally required for attaching a bar above a desired figure. However, the bar is attached before the desired figure in the present specification because there are limitations of description in an electronic filing.

The invention claimed is:

1. A compound semiconductor device comprising:
a semiconductor substrate having a drift layer of a first conductivity type made of a compound semiconductor;
a base region of a second conductivity type formed on the drift layer;
a deep trench penetrating through the base region and into the drift layer;
a first conductivity type region of the first conductivity type formed only at a corner portion of a bottom of the deep trench; and
a deep layer of the second conductivity type formed in the deep trench so as to cover the first conductivity type region, wherein
a cross section of the first conductivity type region in the corner portion of the deep trench is a triangular shape or a rounded triangular shape in which a portion of the first conductivity type region in contact with the deep layer is recessed to have a curved surface, and the deep layer is in contact with the bottom of the deep trench in the cross section, and
the first conductivity type region has a higher first conductivity type impurity concentration than the drift layer.

2. The compound semiconductor device according to claim 1, comprising a vertical MOSFET that includes:
the semiconductor substrate including a rear surface layer that is provided on a rear surface side and has a high impurity concentration, and the drift layer of the first conductivity type is provided on a front surface side to form a ground layer and has a lower impurity concentration than the rear surface layer;
a source region of the first conductivity type formed in an upper portion of the base region and having a higher impurity concentration than the drift layer;
a trench gate structure including a gate insulation layer that is formed on an inner wall of a gate trench provided from a surface of the source region to a position deeper than base region, and a gate electrode formed on the gate insulation layer;
a source electrode electrically coupled with the source region; and
a drain electrode electrically coupled with the rear surface layer on the rear surface side of the semiconductor substrate, wherein
the deep trench penetrates through the source region and the base region into the drift layer and is formed at a position deeper than the gate trench, and
the first conductivity type region is formed at a portion in the deep trench below the base region so as to be apart from the base region.

3. The compound semiconductor device according to claim 1, comprising a junction barrier diode that includes:
the semiconductor substrate including a rear surface layer that is provided on a rear surface side and has a high impurity concentration, and the drift layer of the first conductivity type is provided on a front surface side to form a ground layer and has a lower impurity concentration than the rear surface layer; and
a first conductivity type high concentration layer formed on the drift layer and having a higher impurity concentration than the drift layer, wherein
the deep trench penetrates through the first conductivity type high concentration layer into the drift layer.

4. The compound semiconductor device according to claim 1, wherein the deep layer is set as an upper deep layer, the compound semiconductor device further comprising
a lower deep layer of the second conductivity type formed under the upper deep layer so as to be in contact with the upper deep layer and having a rounded corner portion at a bottom.

* * * * *